US008283685B2

(12) United States Patent
Finger

(10) Patent No.: US 8,283,685 B2
(45) Date of Patent: Oct. 9, 2012

(54) LIGHT-GENERATING ARRANGEMENT

(75) Inventor: Eckhard Finger, Aschaffenburg (DE)

(73) Assignee: Siemens VDO Automotive AG, Regensburg (DE)

( * ) Notice: Subject to any disclaimer, the term of this patent is extended or adjusted under 35 U.S.C. 154(b) by 762 days.

(21) Appl. No.: 11/921,837

(22) PCT Filed: Jun. 2, 2006

(86) PCT No.: PCT/EP2006/062868

§ 371 (c)(1),
(2), (4) Date: Dec. 7, 2007

(87) PCT Pub. No.: WO2006/131501

PCT Pub. Date: Dec. 14, 2006

(65) Prior Publication Data

US 2010/0200878 A1 Aug. 12, 2010

(51) Int. Cl.
*H01L 33/58* (2010.01)

(52) U.S. Cl. ..................... 257/98; 257/99; 257/E33.074

(58) Field of Classification Search .................... 257/98, 257/99, 59, 72, E33.059, E33.067, E33.068, 257/E33.071, E33.073, E33.074
See application file for complete search history.

(56) References Cited

U.S. PATENT DOCUMENTS

| | | | | |
|---|---|---|---|---|
| 5,266,817 | A | 11/1993 | Lin | |
| 5,349,509 | A | 9/1994 | Klug | |
| 6,069,737 | A | 5/2000 | Fetzer et al. | |
| 6,483,976 | B2 | 11/2002 | Shie et al. | |
| 2001/0035713 | A1 | 11/2001 | Kimura | |
| 2002/0080615 | A1* | 6/2002 | Marshall et al. | 362/333 |
| 2003/0169514 | A1 | 9/2003 | Bourdelais et al. | |
| 2003/0189217 | A1* | 10/2003 | Imai | 257/99 |
| 2004/0256628 | A1 | 12/2004 | Chin et al. | |
| 2005/0093008 | A1 | 5/2005 | Suehiro et al. | |
| 2005/0133688 | A1* | 6/2005 | Li et al. | 250/208.1 |
| 2006/0279955 | A1 | 12/2006 | Kettunen et al. | |

FOREIGN PATENT DOCUMENTS

| | | | |
|---|---|---|---|
| DE | 196 19 478 | | 11/1997 |
| EP | 1 420 462 | | 5/2004 |
| JP | 6252450 | A | 9/1994 |
| JP | 61-206212 | | 12/1996 |
| JP | 11-312827 | A | 11/1999 |
| JP | 2002/0080615 | A | 6/2004 |
| JP | 2004-235337 | A | 8/2004 |
| WO | WO 0024062 | A1 * | 4/2000 |
| WO | WO 02/25744 | A1 | 3/2002 |

(Continued)

OTHER PUBLICATIONS

German Office Action dated Mar. 14, 2006 issued in corresponding application No. 10 2005 026 206.6-51.

(Continued)

*Primary Examiner* — Victor A Mandala
*Assistant Examiner* — Selim Ahmed
(74) *Attorney, Agent, or Firm* — Cozen O'Connor

(57) ABSTRACT

The invention relates to a light-generating arrangement comprising a light-emitting semiconductor element provided with electric supply lines and a transparent light-directing element (2) which is arranged upstream of the semiconductor element in the emission direction at a distance therefrom and which is used for concentrating the light emitted by said semiconductor element in such a way that a light stream is formed. The light output surface (4) of the light-directing element (2) comprises a microstructure (6) consisting of a plurality of elevations and cavities deviating the trajectory of the light stream by <5°.

22 Claims, 1 Drawing Sheet

OTHER PUBLICATIONS

Written Report issued in Corresponding International Application No. PCT/EP2006/062868, Date: Jul. 12, 2007.

International Search Report dated Aug. 23, 2006 issued in corresponding application No. PCT/EP2006/062868.

* cited by examiner

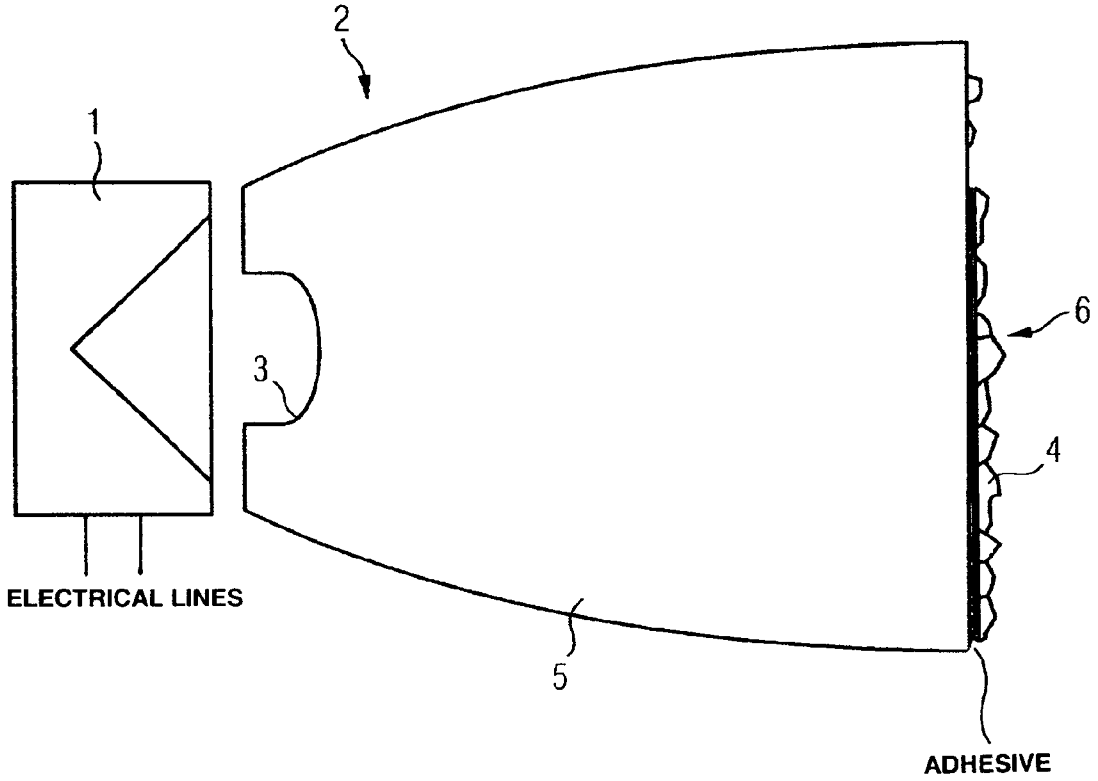
2
1
3
6
4
ELECTRICAL LINES
5
ADHESIVE

LIGHT-GENERATING ARRANGEMENT

CROSS REFERENCE TO THE RELATED APPLICATIONS

This is a U.S. national stage of application No. PCT/EP2006/062868, filed on 2 Jun. 2006. Priority is claimed on the following application: DE 10 2005 026 206.6, filed Jun. 7, 2005, the content of which is incorporated herein by reference.

BACKGROUND OF THE INVENTION

The invention relates to a light-generating arrangement comprising a light-emitting semiconductor element having electrical supply lines, and comprising a transparent light-orienting element arranged in front of the semiconductor element at a distance in the emission direction, by which light-orienting element the light emitted by the semiconductor element can be concentrated to form a directional luminous flux.

Light-emitting semiconductor elements, in particular high-power LEDs, usually have a lambertian emitting characteristic or a very large aperture angle of the emission characteristic. In order to obtain a directional emission, primarily refractive and reflective secondary optics are used as light-orienting element in the case of the high-power LEDs. Said optics lead to a concentration of the luminous flux and to very high luminances in the forward direction.

A significant inhomogeneity of the luminous flux occurs as a result of the structure of the semiconductor elements, in particular also as a result of their electrical supply lines and contact connections.

When a plurality of LED chips are used in an array, the positioning of the individual chips is reflected in the brightness distribution of the luminous flux.

Furthermore, if LED chips of different colors are used then the mixing of the individual color components is usually incomplete. Significant color variations can therefore be observed over the width of the luminous flux.

These influences on the luminous flux are very disturbing and restrict the use of such light-generating arrangements.

SUMMARY OF THE INVENTION

It is therefore an object of the invention to provide a light-generating arrangement of which avoids the foregoing disadvantages, where the luminous flux of the arrangement is highly homogeneous and does not suffer a substantial loss of brightness.

These and other objects and advantages are achieved in accordance with the invention by a coupling-out surface of the light-orienting element that has a microstructure formed from a multiplicity of elevations and depressions, by which microstructure the individual beam paths of the directed light beams of the luminous flux can be deflected by an angle of <5°.

In an embodiment, the wall of the light-orienting element that extends from the coupling-in surface to the coupling-out surface of the light-orienting element includes a microstructure that is formed from a multiplicity of elevations and depressions, by which microstructure the reflection of the individual beam paths of the directed light beams of the directed light beams of the luminous flux at the wall of the light-orienting element can be deflected by an angle of <5°.

By forming a secondary optical element with the light-orienting element, the light emitted in all directions by the semiconductor element is inherently directed and emitted as directional luminous flux.

In addition, the individual beam parts of the directed light beams of the luminous flux are slightly changed by the microstructure such that, although the light is newly distributed within the luminous flux, which can be a light cone after emission, distribution of the light occurs such that essentially no light backscatters or is scattered out of the luminous flux or light cone.

The In the preferred embodiment, the light-orienting element is a converging lens.

A high uniformity of the luminous flux is achieved by virtue of the microstructure having a peak-to-value height of <100 μm.

If the light-orienting element is a plastic injection-molded part having the microstructure integrally formed on its coupling-out surface and/or on its wall, then it is possible, through the injection mold being formed in a corresponding manner, for the microstructure to be concomitantly produced in a cost-effective manner during the production of the light-orienting element.

However, it is also possible for the microstructure to be formed on a transparent film that is fixed on the coupling-out surface by means of a refractive-index-matched adhesive.

A further, likewise simple measure for producing the microstructure is achieved by forming the microstructure by use of a resist which is applied to the coupling-out surface and/or the wall of the light-orienting element and the free surface of which assumes the shape of the microstructure upon curing.

A good homogenization of the luminous flux without actual scattering is achieved by forming the microstructure using a multiplicity of microlenses or microlens-like elevations arranged in a distributed manner on the coupling-out surface and/or on the wall of the orienting element.

Here, the elevations and depression are preferably arranged in a stochastically distributed manner.

BRIEF DESCRIPTION OF THE DRAWINGS

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

The single figure of the drawing shows a schematic cross-sectional illustration of a light-generating arrangement in accordance with the invention.

The illustrated light-generating arrangement has a high-power LED (light-emitting diode) 1 as light-emitting semiconductor element, a light-orienting element 2 arranged in front of said the LED at a distance in the light emission direction.

DETAILED DESCRIPTION OF THE PRESENTLY PREFERRED EMBODIMENTS

The light-orienting element 2 that forms a secondary optical element is produced from a transparent plastic as an injection-molded part.

It is possible for the microstructure to be formed on a transparent film that is fixed on the coupling-out surface by means of a refractive index matched adhesive.

The undirected light emitted by the high-power LED is introduced into the light-orienting element 2 at a coupling-in surface 3 thereof and is oriented inter alia by reflection at the wall 5 of the light-orienting element 2, said wall extending from the coupling-in surface 3 to a coupling-out surface 4 of the light-orienting element 2, to form a luminous flux which emerges homogeneously and directionally at the coupling-out surface 4.

The coupling-out surface 4 has a microstructure 6 composed of a multiplicity of non-uniform elevations and depressions, by means of which the beam paths of the oriented luminous flux, upon emerging from the light-orienting element 2, are deflected by an angle of <5°.

The directional luminous flux is thus maintained to the greatest possible extent. The beam paths are only slightly altered, which leads to a homogenization of the luminous flux.

In an embodiment, instead of arranging the microstructure 6 on the coupling-out surface 4, the microstructure is arranged on the wall 5.

As a result, although the beam paths would be reflected for their orientation, in addition the beam paths would also be deflected by an angle of <5° by the microstructure, whereby the directional luminous flux would acquire a homogenization.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. Moreover, it should be recognized that structures shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A light-generating arrangement comprising:

a light-emitting semiconductor element having electrical supply lines; and a transparent light-orienting element arranged in front of the light-emitting semiconductor element at a distance in a direction of light emission, said light-orienting element concentrating the light emitted by the light-emitting semiconductor element to form a directional luminous flux;

wherein a coupling-out surface of the light-orienting element has a microstructure formed from a multiplicity of nonuniform elevations and depressions having a peak-to-valley height of less than 100 μm, said microstructure deflecting individual beam paths of directed light beams of the luminous flux by an angle of <5°.

2. The light-generating arrangement as claimed in claim 1, wherein the light-orienting element is a converging lens.

3. The light-generating arrangement as claimed in claim 1, wherein the light-orienting element is a plastic injection-molded part having the microstructure integrally formed on the coupling-out surface.

4. The light-generating arrangement as claimed in claim 1, wherein the microstructure is formed on a transparent film and fixed on a coupling-out surface by a refractive-index-matched adhesive.

5. The light-generating arrangement as claimed in claim 2, wherein the microstructure is formed on a transparent film and fixed on a coupling-out surface by a refractive-index-matched adhesive.

6. The light-generating arrangement as claimed in claim 1, wherein the microstructure is formed on a transparent film and is fixed on a coupling-out surface by a refractive-index-matched adhesive.

7. The light-generating arrangement as claimed in claim 1, wherein the microstructure is formed by a resist which is applied to at least one of a coupling-out surface and the wall of the light-orienting element, a free surface of which assumes a shape of the microstructure upon curing.

8. The light-generating arrangement as claimed in claim 2, wherein the microstructure is formed by a resist which is applied to at least one of a coupling-out surface and a wall of the light-orienting element, a free surface of which assumes a shape of the microstructure upon curing.

9. The light-generating arrangement as claimed in claim 1, wherein the microstructure is formed by a resist which is applied to at least one of a coupling-out surface and a wall of the light-orienting element, a free surface of which assumes a shape of the microstructure upon curing.

10. The light-generating arrangement as claimed in claim 1, wherein the microstructure is formed by a multiplicity of microlenses or microlens-like elevations arranged in a distributed manner on at least one of a coupling-out surface and a wall of the light-orienting element.

11. The light-generating arrangement as claimed in claim 1, wherein the elevations and depressions are arranged in a stochastically distributed manner.

12. A light-generating arrangement comprising:

a light-emitting semiconductor element having electrical supply lines; and a transparent light-orienting element arranged in front of the light-emitting semiconductor element at a distance in the emission direction, said light-orienting element concentrating light emitted by the light-emitting semiconductor element to form a directional luminous flux;

wherein a wall of the light-orienting element, which extends from the coupling-in surface to the coupling-out surface of the light-orienting element, has a microstructure formed from a multiplicity of nonuniform elevations and depressions having a peak-to valley height of <100 μm, said microstructure deflecting a reflection of individual beam paths of directed light beams of the luminous flux at the wall of the light-orienting element by an angle of <5°.

13. The light-generating arrangement as claimed in claim 12, wherein the light-orienting element is a converging lens.

14. The light-generating arrangement as claimed in claim 13, wherein the light-orienting element is a plastic injection-molded part having the microstructure integrally formed on the wall of the light orienting element.

15. The light-generating arrangement as claimed in claim 12, wherein the microstructure is formed on a transparent film and fixed on a coupling-out surface by a refractive-index-matched adhesive.

16. The light-generating arrangement as claimed in claim 13, wherein the microstructure is formed on a transparent film and fixed on a coupling-out surface by a refractive-index-matched adhesive.

17. The light-generating arrangement as claimed in claim 12, wherein the microstructure is formed on a transparent film and fixed on a coupling-out surface by a refractive-index-matched adhesive.

18. The light-generating arrangement as claimed in claim 12, wherein the microstructure is formed by a resist which is applied to at least one of a coupling-out surface and the wall of the light-orienting element, a free surface of which assumes a shape of the microstructure upon curing.

19. The light-generating arrangement as claimed in claim 13, wherein the microstructure is formed by a resist which is applied to at least one of a coupling-out surface and the wall of the light-orienting element, a free surface of which assumes a shape of the microstructure upon curing.

20. The light-generating arrangement as claimed in claim 12, wherein the microstructure is formed by a resist which is applied to at least one of a coupling-out surface and the wall of the light-orienting element, a free surface of which assumes a shape of the microstructure upon curing.

21. The light-generating arrangement as claimed in claim 12, wherein the microstructure is formed by a multiplicity of microlenses or microlens-like elevations arranged in a distributed manner on at least one of a coupling-out surface and a wall of the light-orienting element.

22. The light-generating arrangement as claimed in claim 12, wherein the elevations and depressions are arranged in a stochastically distributed manner.

* * * * *